United States Patent
Kobayashi

(10) Patent No.: US 7,678,508 B2
(45) Date of Patent: Mar. 16, 2010

(54) METHOD OF MANUFACTURING MASK BLANK AND METHOD OF MANUFACTURING MASK

(75) Inventor: Hideo Kobayashi, Tokyo (JP)

(73) Assignee: Hoya Corporation, Tokyo (JP)

( * ) Notice: Subject to any disclaimer, the term of this patent is extended or adjusted under 35 U.S.C. 154(b) by 961 days.

(21) Appl. No.: 10/548,270

(22) PCT Filed: Mar. 31, 2004

(86) PCT No.: PCT/JP2004/004584

§ 371 (c)(1),
(2), (4) Date: Sep. 27, 2005

(87) PCT Pub. No.: WO2004/088419

PCT Pub. Date: Oct. 14, 2004

(65) Prior Publication Data

US 2006/0121359 A1    Jun. 8, 2006

(30) Foreign Application Priority Data

Mar. 31, 2003   (JP)   ............................. 2003-096996

(51) Int. Cl.
G03F 1/00   (2006.01)
(52) U.S. Cl. .......................................... 430/5; 430/311
(58) Field of Classification Search ..................... 430/5, 430/311–313, 321–324; 428/433
See application file for complete search history.

(56) References Cited

U.S. PATENT DOCUMENTS

| | | | |
|---|---|---|---|
| 3,488,194 A | | 1/1970 | Lydick et al. |
| 5,326,675 A | * | 7/1994 | Niki et al. .................... 430/326 |
| 6,576,374 B1 | * | 6/2003 | Kim ............................... 430/5 |
| 2002/0006555 A1 | * | 1/2002 | Hasegawa et al. .............. 430/5 |
| 2002/0052100 A1 | * | 5/2002 | Tanaka et al. ................ 438/585 |
| 2003/0152845 A1 | * | 8/2003 | Kumada et al. ................. 430/5 |

FOREIGN PATENT DOCUMENTS

| | | |
|---|---|---|
| JP | U 53-149565 | 11/1978 |
| JP | A 57-13863 | 1/1982 |
| JP | A 57-108855 | 7/1982 |
| JP | A 60-165719 | 8/1985 |
| JP | A 63-160332 | 7/1988 |
| JP | A 06-19122 | 1/1994 |
| JP | A 2001-259502 | 9/2001 |

* cited by examiner

*Primary Examiner*—Mark F Huff
*Assistant Examiner*—Stewart A Fraser
(74) *Attorney, Agent, or Firm*—Oliff & Berridge, PLC

(57) ABSTRACT

To prevent foreign matters from adhering to a substrate, etc., thereby causing inconveniences during storing and transporting a mask blank, or during manufacturing the mask blank and a mask. Thin films 2 and 3 formed in a mask thin film forming step of a mask blank manufacturing steps are covered by a dust-free protective film 5 formed of water-soluble material, thereby preventing foreign matters from adhering to the surface of the mask blank itself and preventing the surface of the mask blank from being damaged in the subsequent step, and when the mask blank is used, the dust-free protective film is removed.

16 Claims, 4 Drawing Sheets

ମETHOD OF MANUFACTURING MASK BLANK AND METHOD OF MANUFACTURING MASK

TECHNICAL FIELD

The present invention relates to a method of manufacturing a mask blank, which is a mask material of a mask for pattern transfer, and a manufacturing method for a mask.

BACKGROUND ART

For example, a mask blank, which is a raw material of a mask (reticule) used for a photolithography method, has a structure in which various kinds of thin films such as a light-shielding film, which is also referred to as an opaque film, and a phase shift film optically relating to a transfer exposure light are formed on a substrate surface, and further, a resist film is formed on an uppermost layer of each kind of the thin film, or an antireflection film and a conductive film are formed on or under the resist film, and further a protective film, etc., for protecting the thin films is formed.

A specific example of this mask blank includes a mask blank having resist, whose uppermost layer is a resist film. The mask blank having resist is formed in such a manner that each kind of thin film is formed on the substrate surface, and thereafter, the resist film is coated thereon by a method such as a spin-coating method, and further a prescribed heating and drying process (including a cooling process), etc., is applied.

Note that the thin film formed on the substrate surface includes the light-shielding film, the phase shift film (in a case of phase shift mask), a reflecting film and an absorbing film (in a case of X-ray mask), or the antireflection film, etc. The above-described thin films have some sort of relation with the transfer exposure light in such a way as to allow the transfer exposure light to pass or inhibit the exposure light from passing, and function to form a prescribed transfer pattern image on a transfer target.

FIG. 2 is a sectional view of the conventional mask blank having resist. As shown in FIG. 2, the mask blank 10 having resist is formed by sequentially forming a light-shielding film 2 and an antireflection film 3 on a substrate 1 such as a glass, etc., and coating thereon a resist film 4 by the spin-coating method, etc. However, in many cases, unnecessary build-up parts 4a are generated in the peripheral edge of the substrate 1 (specifically, a part along four sides of the main surface of the substrate 1), and also an unnecessary side face resist 4b is formed on the side face of the substrate 1.

Meanwhile, generally, the mask blank 10 having resist is contained in a storage container during transporting and storing it. FIG. 3 is a perspective view of an inner box 20 of a storage container 50 for containing plural sheets of mask blanks 10 having resists, and FIG. 4 is a sectional view of the storage container 50.

The storage container 50 includes an outer box 30 and the inner box 20, with the inner box 20 contained and fixed in the outer box 30. The inner box 20 is contained and fixed so that a plurality of grooves 21 are provided on a pair of side wall parts of the container which is a rectangular shape with an upper opening and facing each other, and two sides 10a and 10b of the mask blank 10 having resist are inserted into the grooves 21.

However, as described above, the unnecessary build-up parts 4a and the unnecessary side face resists 4b are formed on two sides 10a and 10b of the mask blank 10 having resist. Therefore, when the mask blank 10 having resist is contained and/or taken in/out of the inner box 20, the unnecessary build-up parts 4a and the unnecessary side face resists 4b are made to touch and rub the grooves 21, etc., of the inner box 20. In addition, a vibration or a shock may be occurred in some cases, caused by moving and transporting it with the mask blank 10 having resist retained by the grooves.

In another case, the unnecessary build-up parts 4a and the unnecessary side face resists 4b may also touch and rub the grooves 21 of the inner box 20 by the vibration and the shock. As a result, the unnecessary build-up parts 4a and the unnecessary side face resists 4b are easily peeled off/fallen off from the substrate 1 to become dust/dirt, which adheres to the mask blank itself or each kind of processing device. This finally causes a defect of the mask (including reticule), which is a product made from the mask blank as a raw material, or causes the possibility of a low yield of the mask.

In order to solve the above-described problems, as a technique to remove the unnecessary resist film formed on the peripheral edge of the substrate 1, a method for selectively removing the unnecessary resist film of the peripheral edge of the substrate after coating resist has been generally used (For example, see patent document 1, patent document 2, and patent document 3).

(Patent Document 1)

Japanese Patent publication No. 57-13863

(Patent Document 2)

Japanese Patent Laid Open No. 63-160332

(Patent Document 3)

Japanese Patent Laid Open No. 2001-259502

DISCLOSURE OF THE INVENTION

However, it has been found that even in the case of the mask blank which selectively removes the unnecessary resist film on the peripheral edge of the substrate by the above-described method, etc., the trouble as will be explained below is involved. Specifically, as described above, the inner box 20 is contained in the outer box 30 with an upper opening. The upper opening of the outer box 30 is freely opened and closed by a lid 40. The lid 40 is provided with a substrate pressing member 41, and by the substrate pressing member 41, the head end face and the side end face of the mask blank 10 having resist are fixed.

Therefore, in addition to the part where the mask blank 10 having resist directly touches the inner box 20, etc., there are many parts where the inner box 20 and the outer box 30 touches to each other. Accordingly, possible factors are considered, contributing to extremely a lot of frictions such as friction in containing or taking the mask blank 10 having resist in or out of the storage container 50, friction of a contact part between the mask blank 10 having resist and the inner box 20, and friction of a contact part between the inner box 20 and the outer box 30, caused by vibration and shock during storing, moving and transporting the mask blank. For this reason, it is extremely difficult to suppress dusting caused by the frictions of all the above-described contact parts. As a result, it has been found that it is extremely difficult to effectively prevent foreign matters from adhering to the surface (that is a resist film (uppermost layer)) of the mask blank or building-up thereon, during moving, transporting, and storing the mask blank with the mask blank contained in a storage container.

Meanwhile, when manufacturing the mask by using the above-described mask blank having resist, the elapsed time and elapse number of days after coating resist until the exposure light step in a mask manufacturing step are varied.

The variation of the time lapse and the number of days from post-coating to the exposure light step affects the variation of a resist sensitivity, to become a CD variation. Therefore, the resist which can reduce post-coating drop of sensitivity and excellent in post-coating stability in storing (excellent in post-coating PCD (Post Coating Delay) stability)) is selected and used as the resist formed on the mask blank.

For the resist excellent in post-coating stability, generally, an additive (for example amine) called quencher is frequently added intentionally. However, while the quencher makes the post-coating stability good, there is a limitation on a design, or a limitation on selecting the resist for the mask blank, such that it is impossible to increase the resist sensitivity to some extent or more. From the perspective of exposure productivity (mask productivity) or exposure quality (for example, variation in resist sensitivity when the resist is heated by electron beam exposure), the resist sensitivity is preferably increased.

Also, in circumstances where further pattern pitch narrowing is requested, there have been raised problems such as deterioration in resist sensitivity or an amount of variation in resist sensitivity caused by the time lapse and the number of days from the post-coating to the exposure light step (that is, post-coating storage). The conventionally allowed deterioration in resist sensitivity or the amount of the variation in resist sensitivity caused by the post-coating storage has not matched the required stability in resist sensitivity. Therefore, it is most preferable to form the resist film just before the exposure light step in the mask manufacturing steps. However, when the mask blank formed with a thin film optically relating to a transfer exposure light on the substrate surface, is contained in the storage container and moved and transported to the mask manufacturing step or stored, adhesion of foreign matters or chemically polluted materials to the surface of the mask blank (thin film optically relating to the transfer exposure light) affects the quality of the resist to be coated on the substrate. This finally causes a defect of the mask or causes the possibility of a low yield of the mask.

In the above-described background, the present invention is provided. A first object of the present invention is to provide a method of manufacturing a mask blank and a method of manufacturing a mask capable of effectively preventing the possibility of inconveniency caused by the adhesion of foreign matters to a substrate, etc., during storing and transporting the mask blank, or in a process of manufacturing a mask blank and a process of manufacturing a mask.

A second object of the present invention is to provide a method of manufacturing a mask allowing the mask blank to be supplied to a mask manufacturing step while maintaining the original sensitivity of resist, suppressing lowering of resist sensitivity caused by storing the mask blank, and suppressing productivity reduction of a mask manufacture.

In order to solve the above-described problems, a first aspect of the present invention provides a method of manufacturing a mask blank, which is a material of a pattern transfer mask formed with a thin film optically relating to a transfer exposure light and/or a thin film used for a mask manufacturing process on a substrate surface, comprising:

forming on a surface of the substrate the thin film optically relating to the transfer exposure light and/or the thin film used for a mask manufacturing process; and forming a dust-free protective film covering the thin film formed in the mask thin film forming step and/or the circumference of the thin film thus formed, wherein the dust-free protective film formed in the dust-free protective film forming step covers the surface of the substrate of the mask blank formed with the thin film and/or the circumference to prevent the surface of the mask blank itself from direct adhesion of foreign matters and from thereby being damaged, and when the mask blank is used, the dust-free protective film is removed.

A second aspect of the present invention provides the method of manufacturing the mask blank according to the first aspect, wherein the dust-free protective film is formed of a material removable by solvent which does not affect the thin film formed on the surface of the substrate of the mask blank.

A third aspect of the present invention provides the method of manufacturing the mask blank according to either of the first or the second aspect of the present invention, wherein the solvent is water.

A fourth aspect of the present invention provides a method of manufacturing the mask blank according to any one of the first to third aspects of the present invention, wherein the thin film and/or the dust-free protective film formed on the peripheral edge of the substrate and used in the mask manufacturing process is removed by the solvent.

A fifth aspect of the present invention provides a method of manufacturing a mask having a mask pattern forming step in which the mask pattern for pattern transfer is formed on a substrate, wherein by using the mask blank manufactured by the method of manufacturing the mask blank according to any one of the first to fourth aspects of the present invention, the mask pattern forming step is executed after the dust-free protective film of the mask blank is removed.

A sixth aspect of the present invention provides the method of manufacturing the mask according to the fifth aspect of the present invention, wherein the thin film optically relating to the transfer exposure is formed on the surface of the substrate, a resist film is formed on the thin film, and a dust-free protective film is formed on the resist film.

A seventh aspect of the present invention provides a method of manufacturing a mask including a mask pattern forming step to form a mask pattern for pattern transfer on a substrate, wherein by using the mask blank which is manufactured in the mask blank manufacturing step of any one of the first aspect to the third aspect of the present invention and in which the dust-free protective film is formed on the surface of the thin film optically relating to the transfer exposure light formed on the surface of the substrate, and after the dust-free protective film of the mask blank is removed, the resist film is formed on the surface of the thin film, and the mask pattern is formed by subjecting the resist film to a mask pattern exposure processing.

Here, the mask blank of this invention has a broadly-defined structure including:

forming a light-shielding film having a light-shielding function for shielding a transfer exposure light;

forming a phase shift film having a function to bring about change of phase differences to the transfer exposure light;

forming a halftone phase shift film, which is a translucent film, having a light shielding function and also a function to bring about the change of phase differences to the transfer exposure light;

forming a reflective film having a function to reflect the transfer exposure light;

forming an absorbing film having a function to suppress the reflection by absorbing the transfer exposure light; and forming laminates of the above films, including all functional films required for realizing the function of the transmission type and the reflection type masks or the laminates of such films; or forming resist-coated films by coating resist thereon, or further forming a single anti-reflection film and a single conductive film or the laminates thereof on or under the resist film; and forming an environmental resistance protective film on the resist film or on the laminated films including the resist film. Or the above-described films may not be formed.

Also, the mask blank includes a mask blank for LSI (Semiconductor integrated circuit), and a mask blank for various kinds of PD (Panel display). The material of the substrate is not particularly limited. Synthetic quartz glass, alkalifree glass, borosilicate glass, alumino-silicate glass, and soda lime glass are generally used as a transparent substrate. In addition, ultralow expansion glass or ultralow ceramic is used as the substrate material for reflection type mask.

The thin film formed on the surface of the substrate includes the light-shielding film, the phase shift film (in the case of phase shift mask), the reflective film and the absorbing film (in the case of X-ray mask), or the antireflection film, etc. These films relate to the transfer exposure light in some way such as allowing and inhibiting the passing of the transfer exposure light, and thereby functioning to form a prescribed transfer pattern image on the transfer target. In addition, the thin film formed on the surface of the substrate also includes the thin film used for a mask manufacturing process, for example, the resist film.

The resist may be either a negative type or a positive type. Also, the kind of the resist is not particularly limited, but may be anything such as light (ultraviolet radiation and far ultraviolet radiation, etc,) exposure lithography resist and an electron beam light exposure lithography resist, etc. The resist forming method is not particularly limited either, and may be anything such as a spin-coating method, a Capillary coating method, and a Scan coating method, etc.

Also, in the present invention, the dust-free protective film may be anything, provided that it neither dissolves into nor mix with the thin film and the resist film optically relating to the transfer exposure light such as water-soluble resin, an organic solvent-soluble resin, an inorganic material film, and a light-shielding film etc., and it does not cause damage to the thin film, the resist film, and other thin films, etc., optically relating to the transfer exposure light, by forming and peeling (removing) the dust-free protective film. Moreover, the dust-free protective film is removed just before using the mask blank, that is, prior to the resist exposure light step, which is a first step of the mask manufacturing step. In addition, when the dust-free protective film is formed by coating resist just before the resist exposure step in the mask manufacturing steps, the dust-free protective film is removed prior to coating resist. Accordingly, the function of the dust-free protective film is maintained from just after an uppermost layer such as resist is formed to just before the mask blank is removed from the storage container 50. In addition, the dust-free protective film which does not affect the function of the mask blank or the thin film and the resist film optically relating to the transfer exposure light or which does not affect the mask manufacturing step is previously selected.

In addition, in the mask blank having resist, it is preferable to remove an unnecessary resist film on the peripheral edge of the substrate before forming the dust-free protective film, to remove the dust-free protective film of the contact part on the peripheral edge of the substrate after forming the dust-free protective film, or to remove the unnecessary parts of both the resist film and the dust-free protective film. By the dust-free protective film, the surface of the blank is protected from direct adhesion of dust. However, the generation of the dust itself can be suppressed by previously removing the unnecessary film from the peripheral edge of the substrate or the contact part, thereby preventing pollution caused by the dust, for example, in the forming step or the removing step of the dust-free protective film.

BEST MODE FOR CARRYING OUT THE INVENTION

Figure 1:
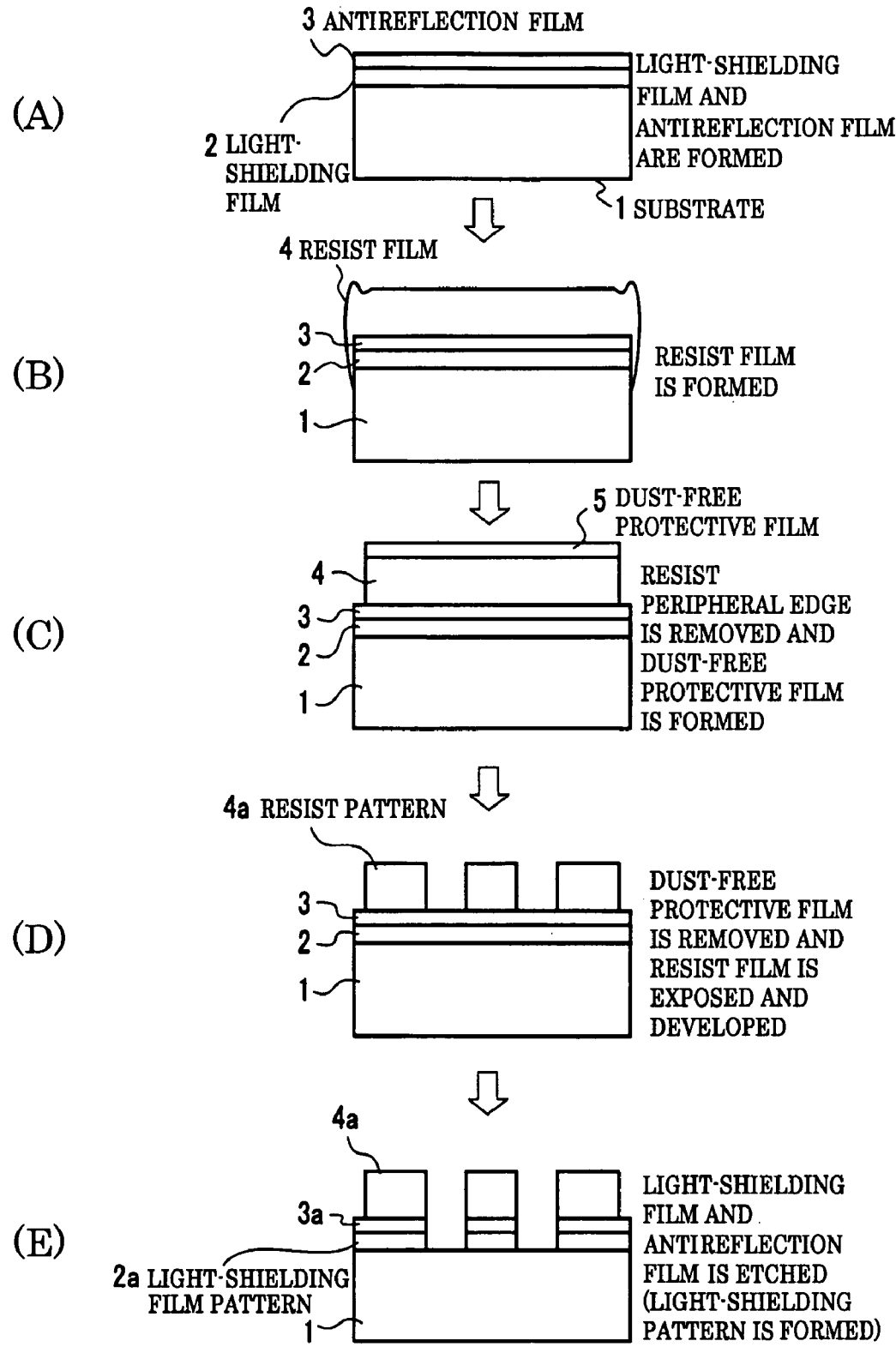
FIG. 1 is an example of a mask blank manufacturing step.
Figure 2:
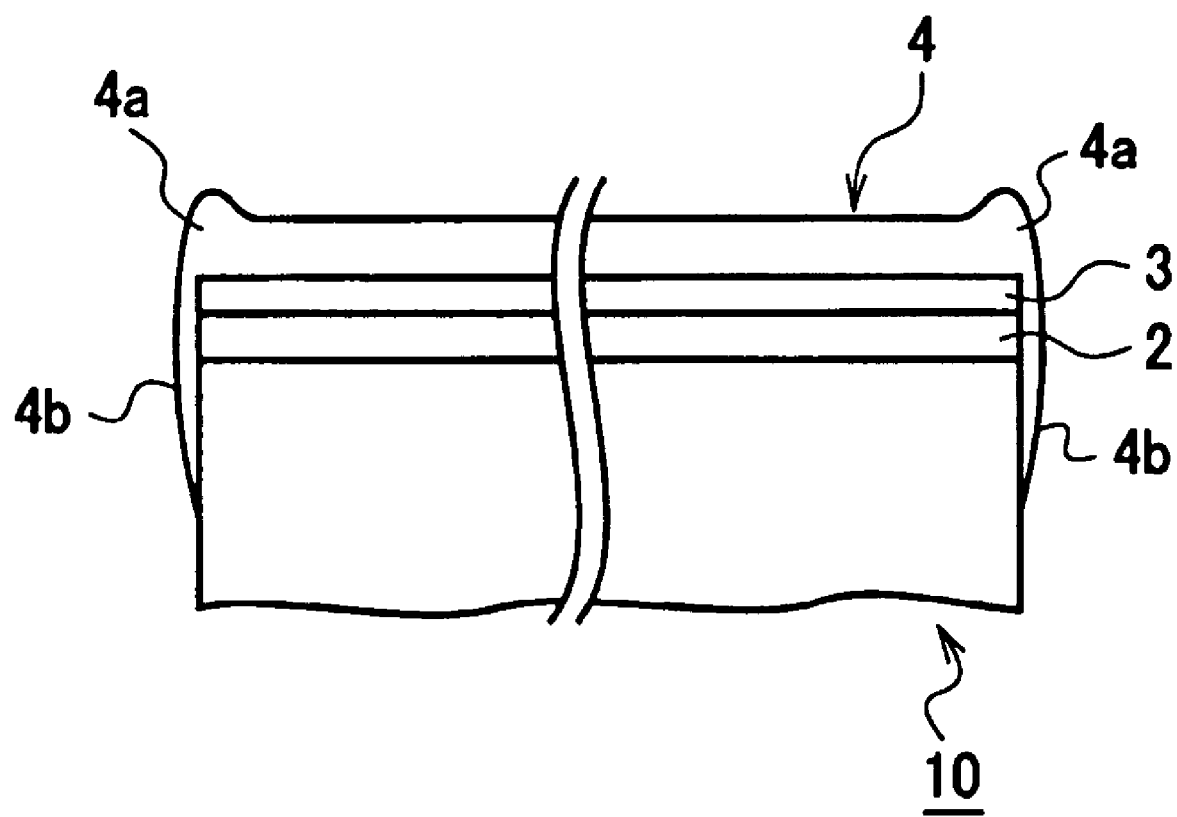
FIG. 2 is a sectional view of the conventional mask blank having resist.
Figure 3:
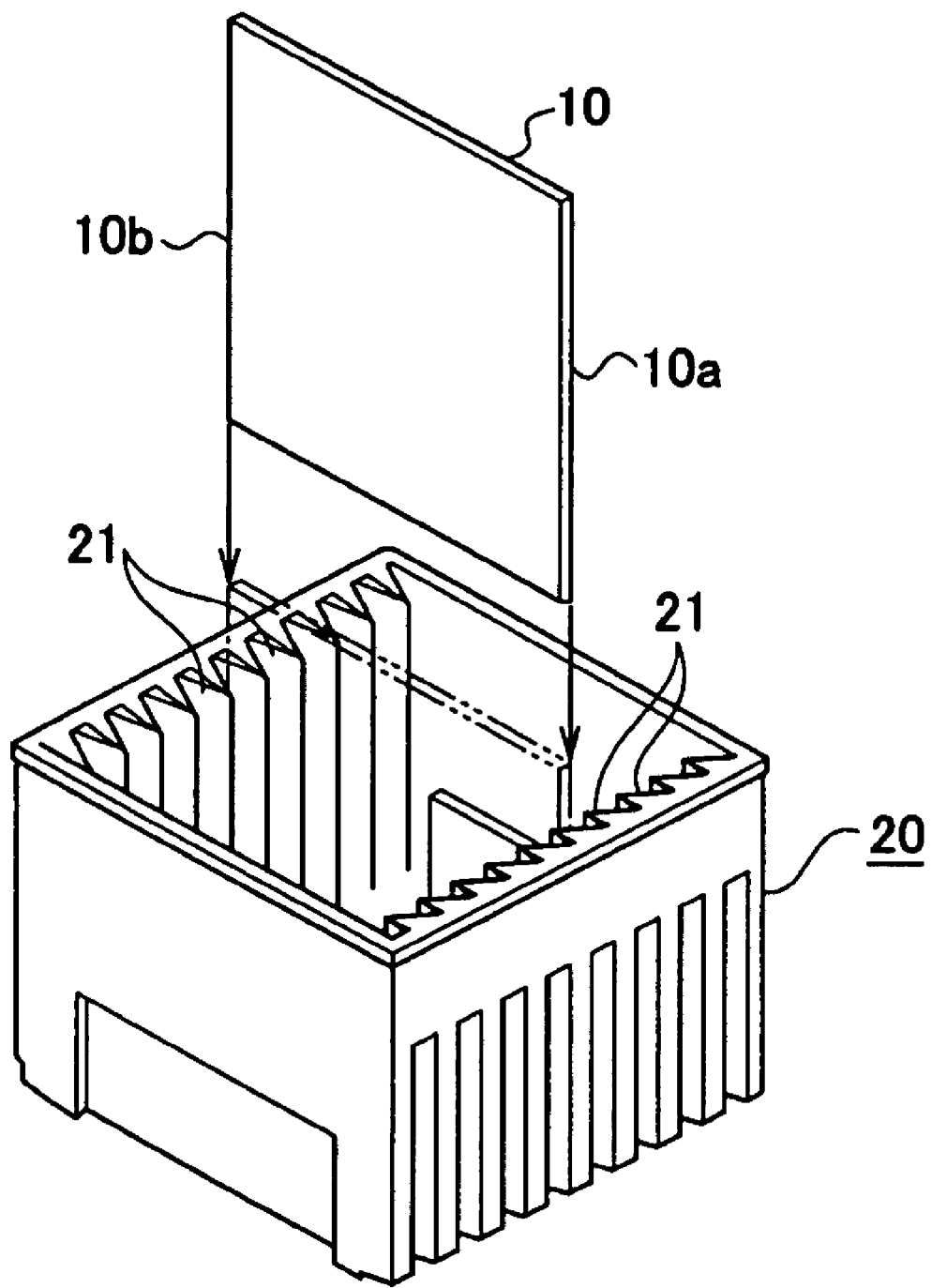
FIG. 3 is a perspective view of an inner box 20 of a storage container 50 in which plural sheets of mask blanks 10 having resists are contained.

FIG. 1 is an explanatory view of a mask manufacturing method according to an example of the present invention. The mask manufacturing method according to the example of the present invention will be explained with reference to FIG. 1 hereunder.

Example 1

First, a mask blank is manufactured. As shown in FIG. 1(A), a light-shielding film 2 of 45 nm thickness containing chrome as a main composition was formed by sputtering on a suitably polished synthetic quartz substrate 1 of 6 inch×6 inch length and 0.25 inch thickness. Subsequently, an antireflection film 3 of 25 nm thickness containing chrome oxide as a main composition was formed on the light-shielding film 2 by sputtering.

Next, as shown in FIG. 1(B), a resist 4 (Chemically amplified positive resist for electron beam light exposure FEP171: developed by FUJIFILM Arch Co, Ltd.) was spin-coated on an antireflection film 3 so that the film thickness after heating and drying treatment becomes 300 nm.

Next, as shown in FIG. 1(C), an unnecessary resist formed on the peripheral edge of the substrate 1 was removed and a dust-free protective film 5 was formed on the resist film 4. In this case, in removing the unnecessary resist, the known apparatus for removing unnecessary film (for example, an apparatus described in Japanese Patent Laid Open No. 2001-259502) was used and organic solvent was used as solvent, and the unnecessary resist film on the peripheral edge of the substrate was thereby dissolved and removed. In addition, after the unnecessary resist was dissolved and removed, a hot plate whose temperature was set to be 150° C. (proximity gap=0.2 mm) was used for heating and drying treatment for 10 minutes after coating, and a mask blank having resist was thereby prepared. Thereafter, by using a laser scan foreign matter inspection apparatus (developed by HITACHI, GM-1000), the number of foreign matter defects on the main surface of the mask blank was measured. In the measurement, the number of foreign matters (having the size of 0.25 μm or more) on the surface of an effective region 142 mm angle (substrate center) of the mask blank was measured.

In addition, the dust-free protective film 5 was formed in such a manner that a solution of a water soluble resin having high purity TPF (developed by TOKYO OHKA KOGYO CO., LTD.) was spin-coated so that the film thickness after being subjected to baking and drying treatment becomes 800 nm. Thereafter, the unnecessary film removing apparatus (for example, apparatus described in Japanese Patent Laid Open No. 2001-259502) was used, and the unnecessary part of the dust-free protective film 5 on the peripheral edge of the substrate 1 was dissolved and removed by using pure water as solvent. Subsequently, by using the hot plate whose temperature was set to be 100° C. (proximity gap: 0.2 mm), the baking and drying treatment was applied for five minutes after coating the dust-free protective film, and the mask blank having the dust-free protective film of the present invention was thereby achieved.

Figure 4:
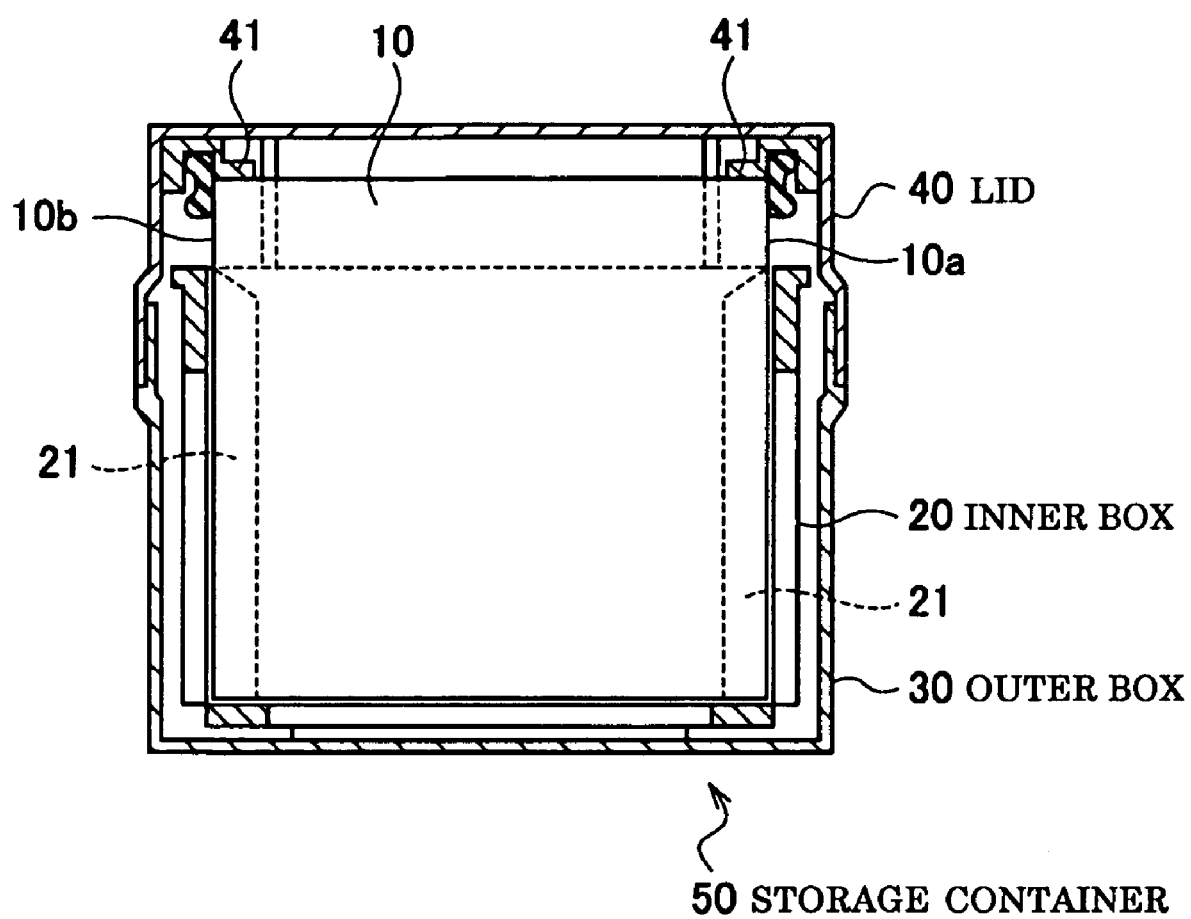
FIG. 4 is a sectional view of the storage container 50.
1 Substrate
2 Light-shielding film
3 Antireflection film
4 Resist film
5 Dust-free protective film

Here, the mask blank having dust-free protective film obtained in this stage was contained in the inner box 20 set in the outer box 30 of the storage container 50 as shown in FIG. 4, and a lid 40 is applied thereon and fixed by a vinyl tape. Then, the storage container 50 thus containing the mask blank was put in a bag made of resin and thermally sealed, thereby inhibiting the invasion of the foreign matters from outside, and then was packed for transport in a packing box formed of a cushioning material made of styrene foam and corrugated board, and a vibration test process was executed, assuming that the mask blank was transported. The vibration test was conducted by following the process (Process in three directions XYZ so that the acceleration becomes twice) in an environment of a common vehicle of "MIL STD-810D 514.3).

Next, after the above-described vibration test process, assuming that the mask blank was stored, the storage container having mask blank after the above-described vibration test was taken out from the packing for transport, then put in the bag made of resin and let it stand in a clean room where humidity and temperature were controlled for 30 days in a state of thermally sealed. Next, as shown in FIG. 1D, a mask blank 10 after the storage process (in this case, the dust-free protective film was formed on the resist film) was taken out from the storage container 50. Then, the dust-free protective film 5 made of water soluble resin was dissolved and removed.

Here, the number of foreign matters on the surface of the mask blank was measured again by the laser scan foreign matter inspection apparatus again, and increase (difference) in foreign matters before and after the vibration test process was obtained. As a result, the increasing number of the foreign matters was 0.6, which was an extremely small number. In this case, a mean value of the increasing foreign matters of five sheets of mask blanks contained in one storage container 50 was used as the increasing number of the foreign matters. Note that as a comparison, the increase (difference) in foreign matters before and after the vibration test process was obtained under the same condition but providing the dust-free protective film. As a result, the increasing number of the foreign matters was 68. Incidentally, in a case where the dust-free protective film was not provided and also the peripheral edge of the resist was not removed, the increasing number of the foreign matters obtained in similar way was 234.

Thereafter, the resist film 4 is patternwise exposed, subjected to PEB (Post-Exposure Bake) processing, and subsequently developed, thus forming a resist pattern 4a. Here, the dust-free protective film 5 was dissolved and removed by processing the substrate for one minute by spraying pure water, while rotating it at a prescribed number 500 rpm of revolutions so as to be dissolved and removed, and subsequently was dried by rotating it at a high speed of 2000 rpm for 30 seconds.

In addition, the resist film 4 was exposed, heated (PEB), and developed as described below. Specifically, the resist film 4 (the above-described FEP 171) was exposed to light (at an acceleration voltage of 20 kV and at an exposure of 3.5 uC/cm$^2$), and after exposure to light, heated (Post-Exposure Bake processing, at 150° C., for 10 minutes), developed (by a splaying method, in 2.38% TMAH development liquid, for 60 seconds), and a resist pattern 4a was thereby formed.

Here, the dimension of a space part of the resist pattern 4a thus formed (line and space pattern of design value of 400 nm) was measured by measuring length SEM, and the value of 415 nm was thereby obtained as a result. Meanwhile, as a comparative example 1, in the mask blank prepared without using the dust-free protective film, the resist film was patterned under the same condition as described above, and a line and space pattern having the design value of 400 nm was thereby obtained, and the dimension of the space part of the line and space pattern was 411 nm. Difference in dimension of the space parts of both of the line and space patterns was lower than a range of error caused by no stability in a patterning process including measuring. Accordingly, it can be judged that by adopting the dust-free protective film, the resist film was not affected.

As described above, in the mask blank (mask blank prepared by removing the peripheral edge) prepared by "a method of selectively removing the unnecessary resist film on the peripheral edge of the substrate after resist coating", which is a generally widely used technique, the resist film is free of peeling and falling off caused by the friction between the mask blank and the storage container by vibration. Therefore, if compared with the mask blank which does not remove the unnecessary resist film on the peripheral edge of the substrate, the increase in foreign matters is obviously suppressed before and after the vibration test process. However, even if removing the unnecessary resist film on the peripheral edge of the substrate, the increase in foreign matters is not reduced to zero before and after the vibration test process.

The reason for this is considered that by the vibration test process (acceleration evaluation, assuming that the mask blank is moved and transported), dust/dirt is generated by the friction between the mask blank and the storage container 50, and the friction in a contact part of each constituent member of the storage container 50 (for example, the contact part between the inner box 20 and the inner side of the outer box 30), thereby polluting the main surface of the substrate. It is considered that the above-described dust/dirt is generated by the friction between each constituent member of the storage container 50, or peeling and falling off of each film formed on the mask blank before the resist film is formed, resulting in adhering to the surface of the mask blank (on the resist film). It is obvious that the above-described polluted foreign matters finally become the cause of the defects of the mask (including reticule), or the cause of low yield of the mask.

Example 2 and Comparative Example 2

Next, a mask manufacturing method according to another example will be explained with reference to FIG. 1.

First, the mask blank is manufactured. As shown in FIG. 1(A), a light-shielding film 2 of 45 nm thickness containing chrome as a main composition was formed by sputtering on a suitably polished synthetic quartz substrate 1 of 6 inch×6 inch length and 0.25 inch thickness. Subsequently, an antireflection film 3 of 25 nm thickness containing chrome oxide as a main composition was formed on the light-shielding film 2 by sputtering. Whereby, the mask blank having light-shielding film (having no resist film 4 formed thereon) was prepared.

Thereafter, the number of defects of foreign matters on the main surface of the mask blank was measured by a laser scan foreign matter inspection apparatus (developed by HITACHI, GM-1000). In the measurement, the number of foreign matters (having the size of 0.25 μm or more) present on the surface of an effective region 142 mm angle (substrate center) of the mask blank was measured.

Subsequently, the dust-free protective film 5 was formed as will be described below. The solution of a water soluble resin having high purity TPF (developed by TOKYO OHKA KOGYO CO., LTD.) was spin-coated so that the film thickness becomes 800 nm after baking and drying treatment, for example. Thereafter, the unnecessary film removing apparatus (for example, apparatus described in Japanese Patent Laid Open No. 2001-259502) was used, and the unnecessary part on the peripheral edge of the substrate 1 of the dust-free protective film 5 was dissolved and removed by using pure water as solvent. Subsequently, by using the hot plate whose temperature was set to be 100° C. (proximity gap: 0.2 mm), the baking and drying treatment was applied for five minutes after coating the dust-free protective film, and the mask blank having dust-free protective film of the present invention was thereby achieved.

Here, the mask blank having dust-free protective film obtained in this stage was contained in the inner box 20 set in the outer box 30 of the storage container 50 as shown in FIG. 4, and a lid 40 is applied thereon and fixed by a vinyl tape. Then, the storage container 50 thus containing the mask blank was put in a bag made of resin and thermally sealed, thereby inhibiting the invasion of the foreign matters from outside, and then was packed for transport in a packing box formed of a cushioning material made of styrene foam and corrugated board, and the completely same vibration test process as the example 1 was conducted, assuming that the mask blank was transported.

Next, after the above-described vibration test process, assuming that the mask blank was stored, the container having mask blank after the above-described vibration test was taken out from the packing for transport, then put in the bag made of resin and let it stand in a clean room where humidity and temperature were controlled, for 30 days in a state of thermally sealed. Next, as shown in FIG. 1D, a mask blank 10 after the storing process (in this case, the dust-free protective film was formed on the light-shielding film (the resist film was not formed)) was taken out from the storage container 50. Then, the dust-free protective film 5 made of water soluble resin was dissolved and removed.

Here, the number of the foreign matters on the surface of the mask blank was measured again by the laser scan foreign matter inspection apparatus, and the increase (difference) in the foreign matters before and after the vibration test process and 30-days storage was obtained. As a result, the increasing number of the foreign matters was 0.4, which was extremely small number. In this case, the mean value of the number of foreign matters of five sheets of mask blanks contained in one storage container 50 was used as the increasing number of the foreign matters. Thereafter, a resist film 4' was formed by coating resist, and the resist film 4' was subjected to a pattern exposure, and after exposure, the resist film 4' is heated (PEB processing) and developed, and the resist pattern a' was thereby formed. The dust-free protective film 5 was dissolved and removed in such a manner that the substrate was subjected to processing for one minute by spraying pure water, while rotating it at a prescribed number 500 rpm of revolutions so as to be dissolved and removed, and subsequently was dried by rotating it at a high speed of 2000 rpm for 30 seconds.

Note that as a comparative example 2, the increase (difference) in the foreign matters before and after the vibration test process and 30-day storage was obtained, under the same condition but providing the dust-free protective film. As a result, the increasing number of foreign matters was 57.

In addition, as shown in FIG. 1(B), the resist is applied on the anti-reflection film 3 in such a manner that the resist 4 (Chemically amplified positive resist for electron beam light exposure FEP171: developed by FUJIFILM Arch Co, Ltd.) was spin-coated on the antireflection film 3 so that the film thickness after heating and drying treatment becomes 300 nm, and thereafter, a hot plate whose temperature was set to be 150° C. (proximity gap=0.2 mm) was used for heating and drying treatment for 10 minutes after coating.

Moreover, the resist film 4 is exposed to light, heated (PEB process), and developed in such a manner that the resist film 4 (the above-described FEP 171) was exposed to light (at an acceleration voltage of 20 kV and at an exposure of 3.5 μC/cm$^2$), and after exposure to light, heated (Post-Exposure Bake (PEB) processing, at 150° C., for 10 minutes), developed (by a splaying method, using 2.38% TMAH development liquid, for 60 seconds g), and the resist pattern 4a was thereby formed.

Here, the dimension of a space part of the resist pattern 4a thus formed (line and space pattern of design value of 400 nm) was measured by measuring length SEM, and the value of 401 nm was thereby obtained as a result. Meanwhile, as the comparative example 2, the resist was applied on the mask blank stored for 30 days without using the dust-free protective film (in this case, the dust-free protective film was formed on the light-shielding film (the resist film was not formed)) under the same condition as described above, followed by patterning to obtain the line and space pattern having design dimension of 400 nm. Then, the dimension of the space part of the line and space pattern was measured by the measuring length SEM, and the value of 398 nm was thereby obtained as a result. Difference in dimension of the space parts of both of the line and space patterns was lower than the range of error caused by no stability in a patterning process including measuring. Accordingly, it can be judged that by adopting the dust-free protective film, the resist film was not affected.

Moreover, as described in the example 1, compared with the case where the dust-free protective film was formed on the resist film, the dimension of the space part of the line and space pattern having the design dimension of 400 nm is smaller by 14 nm (415 nm versus 401 nm), and the resist sensitivity was maintained high. It is judged that the above-described difference in dimension (14 nm) is caused by the deterioration in resist sensitivity due to 30-day storage. Namely, in the case of the example 2 where the resist was applied just before light exposure, original resist sensitivity could be obtained. Meanwhile, in the case of the example 1 where the resist film was formed and subsequently patterned after 30-day storage was passed, the original resist sensitivity was damaged (lowered).

As described above, as shown in the examples 1 and 2, in the mask blank having the dust-free protective film, it became possible to prevent the friction caused by the mask blank and the storage container 50 when putting and taking out the mask blank in and from the storage container 50, the friction caused by the mask blank and the storage container 50 caused by vibration and shock occurred when storing, moving and transporting the mask blank contained in the storage container 50, and the friction caused by the contact part between each constituent member of the storage container 50, and direct adhesion of dust/dirt thereby generated to the mask blank itself. When manufacturing the mask by using the mask blank having resist, by removing the dust-free protective film prior to the light exposure step, which is a first step of the mask manufacturing step, and when the resist is applied and formed just before the light exposure step, by removing the dust-free protective film prior to resist coating, the dust/dirt adhered to the surface of the dust-free protective film after the dust-free protective film was formed was removed, thereby preventing the increase in surface defects of the mask blank (foreign matters), and providing the quality of the mask blank just after completion of the mask blank to the mask manufacturing step. In addition, by using a water soluble resin having high purity and showing almost neutrality and which does not affect the thin film and the resist film optically relating to the transfer exposure light, for the dust-free protective film, pattern forming was achieved without deterioration in function of the resist caused by forming, peeling and removing the dust-free protective film.

Here, in the example 1, the water soluble resin of almost neutral which neither damages nor affects the chemically amplified positive resist film by forming or removing the dust-free protective film without dissolving the resist film or mixing with the resist film, was used for the dust-free protective film. However, the dust-free protective film is not limited to the water-soluble resin such as an organic solvent-soluble resin, an inorganic material film, etc., provided that it neither damages nor affects the resist film by forming and pealing (removing) the dust-free protective film, or the dust-free protective film is not limited to the water-soluble resin, provided that it does not affect the function of the resist film (sensitivity, a residual film rate, and pattern forming, etc), even if it slightly damages the resist film. When the uppermost layer is made of the film other than the resist film, the dust-free protective film is not limited to the water-soluble resin, provided that the function is neither damaged nor affected.

In addition, in the examples 1 and 2, the thickness of the coating film of the dust-free protective film was set to be 800 nm, but it is not limited thereto. For example, in the mask blank having resist, the film thickness is not concerned, provided that the dust-free protective film has a film thickness capable of preventing the dust/dirt from directly adhering to the resist film (blank)(function as the dust-free protective film can be secured and maintained).

In addition, in the example 1, the dust-free protective film was formed after selectively removing the unnecessary resist film on the peripheral edge of the substrate. However, the unnecessary resist film on the peripheral edge of the substrate may not be removed. Further, in the examples 1 and 2, after forming the dust-free protective film, the unnecessary dust-free protective film on the peripheral edge of the substrate was selectively removed. However, it may not be removed.

However, it is preferable to remove the unnecessary resist film on the peripheral edge of the substrate before forming the dust-free protective film, remove the dust-free protective film on the peripheral edge of the substrate after forming the dust-free protective film, or remove the unnecessary parts of both the resist film and the dust-free protective film. Moreover, although the surface of the resist (blank) is protected from the direct adhesion of the dust/dirt by the dust-free protective film, by previously removing the unnecessary resist film and the dust-free protective film from the peripheral edge of the substrate or the contact part, the generation of the dust/dirt itself can be suppressed. For example, the pollution caused by the dust/dirt in the forming step or the removing step of the dust-free protective film can be prevented.

In addition, in the example 1, the unnecessary parts of the resist film and the dust-free protective film on the peripheral edge of the substrate were removed just after forming each film. However, after the dust-free protective film is formed, the unnecessary parts of both laminated films may be removed at once. This is applied not only to the case where the dust-free protective film is formed on the mask blank formed with only the resist film, but also the case where the antireflection film, the conductive film, and the environmental resistance protective film are laminated.

In addition, in the example 2, the water soluble resin was selected to be the dust-free protective film. However, the dust-free protective film may be anything, provided that it neither damages nor affects the thin film optically relating to the transfer exposure light even by forming and peeling (removing) the dust-free protective film. A film forming method may be anything such as a coating method, a sputtering method, etc., and a peeling method may also be anything such as a dissolving and removing method or a dry etching method, etc.

In addition, in the examples 1 and 2, in order to examine the effect of the dust-free protective film, after coating resist (example 1) and after forming the thin film optically relating to the transfer exposure light (example 2), the number of foreign matters on the surface of the mask blank were subsequently measured by the laser scan foreign matter inspection apparatus, and thereafter the dust-free protective film was formed. However, the dust-free protective film may be formed immediately after coating resist. Thus, it becomes possible to prevent the direct adhesion of the dust/dirt to the surface of the mask blank (that is, resist film) in the foreign matter inspection step after coating resist.

In addition, in the examples 1 and 2, after passing through the vibration test process assuming that the mask blank was transported, and after removing the dust-free protective film, the number of foreign matters on the surface of the mask blank was measured by the laser scan foreign matter inspection apparatus prior to the exposure process. However, such a measurement is not necessarily required.

As shown in the examples 1 and 2, by the method of manufacturing the mask blank and the method of manufacturing the mask of the present invention, the pollution by foreign matters (increase in foreign matters) on the surface of the mask blank (that is, the resist film (or uppermost layer)) caused by the generation of the dust due to the friction between the mask blank and the storage container 50, or the friction between each constituent member of the storage container 50 caused by the vibration or the shock occurred when storing, moving, or transporting the mask blank contained in the storage container 50, is largely decreased.

By the method of manufacturing the mask blank, and the method of manufacturing the mask of the present invention, it becomes possible to supply the mask blank to a mask manufacturing step, while maintaining the surface defect (foreign matter) quality of immediately after coating resist (immediately after completing mask blank). Whereby, the pollution caused by foreign matters (increase in foreign matters) on the surface of the mask blank by putting and taking out the mask blank in and from the storage container 50 and due to the vibration or the shock by storing, moving, or transporting the mask blank contained in the storage container 50, is suppressed, thereby also suppressing mask defects and a low yield of a mask manufacture.

In addition, the dust-free protective film can be formed by the spin-coating method used for forming the resist film, and can be dissolved and removed by a spray developing rotation processing method used for the developing processing of the resist film. Therefore, the existent technique or device can be diverted, thereby requiring no new technique or equipment for forming and removing the film.

INDUSTRIAL APPLICABILITY

As described above in detail, according to the present invention, first, it becomes possible to effectively prevent foreign matters from adhering to the substrate, etc., thereby causing inconveniences during storing and transporting the mask blank, or during the manufacturing process of the mask blank and the mask. Second, it becomes possible to supply the mask blank to the mask manufacturing step, while maintaining the original sensitivity of the resist, thereby suppressing the decrease in sensitivity of the resist caused by storing of the mask blank, and thereby also suppressing the decrease in productivity of the mask manufacture.

The invention claimed is:

1. A method of manufacturing a mask blank used as a material of a pattern transfer mask, having a substrate and a thin film optically relating to a transfer exposure light which is a material of a pattern transfer mask, comprising:

forming the thin film on the surface of the substrate; and forming a dust-free protective film which is formed of a material removable by solvent which does not affect the thin film, so that the thin film is covered by the dust-free protective film, wherein an unnecessary part formed on a peripheral edge of the substrate of the dust-free protective film is removed by the solvent, thereby preventing a surface of the mask blank itself from direct adhesion of foreign matters and from thereby being damaged in the subsequent step, and when the pattern transfer mask is manufactured from the mask blank, the dust-free protective film is removed by the solvent before a resist film forming step for forming a resist film on the thin film.

2. The method of manufacturing the mask blank according to claim 1, wherein the solvent is water.

3. A method of manufacturing a pattern transfer mask including a mask pattern forming step to form a mask pattern for pattern transfer on a substrate, wherein the mask blank is manufactured using the manufacturing step of claim 1, and after the dust-free protective film of the mask blank is removed, the resist film is formed on the surface of the thin film, and the mask pattern is formed by subjecting the resist film to a mask pattern exposure processing.

4. A method of manufacturing a pattern transfer mask including a mask pattern forming step to form a mask pattern for pattern transfer on a substrate, wherein the mask blank is manufactured using the manufacturing step of claim 2, and after the dust-free protective film of the mask blank is removed, the resist film is formed on the surface of the thin film, and the mask pattern is formed by subjecting the resist film to a mask pattern exposure processing.

5. A method of manufacturing a mask blank used as a material of a pattern transfer mask, having a substrate, a thin film optically relating to a transfer exposure light which is a material of a pattern transfer mask, and a resist film used for a mask manufacture process, comprising:

forming the thin film on the surface of the substrate;

forming the resist film on the thin film; and forming a dust-free protective film which is formed of a material removable by solvent which does not affect the thin film and the resist film so that the thin film is covered by the dust-free protective film, wherein an unnecessary resist formed on a peripheral edge of the substrate is removed, and an unnecessary part formed on the peripheral edge of the substrate of the dust-free protective film is removed by the solvent, thereby preventing a surface of the mask blank itself from direct adhesion of foreign matters and from thereby being damaged in the subsequent step, and when the pattern transfer mask is manufactured from the mask blank, the dust-free protective film is removed by the solvent before exposure processing of the mask pattern formed on the thin film is performed to the resist film.

6. The method of manufacturing the mask blank according to claim 5, wherein the solvent is water.

7. The method of manufacturing the mask blank according to claim 5, wherein the resist used for the resist film is an electron beam light exposure lithography resist.

8. The method of manufacturing the mask blank according to claim 6, wherein the resist used for the resist film is an electron beam light exposure lithography resist.

9. The method of manufacturing the mask blank according to claim 7, wherein the resist is a chemically amplified resist.

10. The method of manufacturing the mask blank according to claim 8, wherein the resist is a chemically amplified resist.

11. A method of manufacturing a pattern transfer mask including a mask pattern forming step to form a mask pattern for pattern transfer on a substrate, wherein by using the mask blank manufactured by the method of manufacturing according to claim 5, and after removing the dust-free protective film of the mask blank, the mask pattern forming step is executed.

12. A method of manufacturing a pattern transfer mask including a mask pattern forming step to form a mask pattern for pattern transfer on a substrate, wherein by using the mask blank manufactured by the method of manufacturing according to claim 6, and after removing the dust-free protective film of the mask blank, the mask pattern forming step is executed.

13. A method of manufacturing a pattern transfer mask including a mask pattern forming step to form a mask pattern for pattern transfer on a substrate, wherein by using the mask blank manufactured by the method of manufacturing according to claim 7, and after removing the dust-free protective film of the mask blank, the mask pattern forming step is executed.

14. A method of manufacturing a pattern transfer mask including a mask pattern forming step to form a mask pattern for pattern transfer on a substrate, wherein by using the mask blank manufactured by the method of manufacturing according to claim 8, and after removing the dust-free protective film of the mask blank, the mask pattern forming step is executed.

15. A method of manufacturing a pattern transfer mask including a mask pattern forming step to form a mask pattern for pattern transfer on a substrate, wherein by using the mask blank manufactured by the method of manufacturing according to claim 9, and after removing the dust-free protective film of the mask blank, the mask pattern forming step is executed.

16. A method of manufacturing a pattern transfer mask including a mask pattern forming step to form a mask pattern for pattern transfer on a substrate, wherein by using the mask blank manufactured by the method of manufacturing according to claim 10, and after removing the dust-free protective film of the mask blank, the mask pattern forming step is executed.

* * * * *